(12) United States Patent
Schuck

(10) Patent No.: US 11,228,175 B2
(45) Date of Patent: Jan. 18, 2022

(54) DI-CIRCUIT BREAKER DEVICE AND OPERATING METHOD FOR DETECTING A VOLTAGE ON A PEN CONDUCTOR

(71) Applicant: Heinrich Kopp GmbH, Kahl am Main (DE)

(72) Inventor: Nicolas Schuck, Aschaffenburg (DE)

(73) Assignee: Heinrich Kopp GmbH, Kahl am Main (DE)

( * ) Notice: Subject to any disclaimer, the term of this patent is extended or adjusted under 35 U.S.C. 154(b) by 24 days.

(21) Appl. No.: 16/492,540

(22) PCT Filed: Mar. 6, 2018

(86) PCT No.: PCT/EP2018/055417
§ 371 (c)(1),
(2) Date: Sep. 9, 2019

(87) PCT Pub. No.: WO2018/162452
PCT Pub. Date: Sep. 13, 2018

(65) Prior Publication Data
US 2021/0143635 A1    May 13, 2021

(30) Foreign Application Priority Data
Mar. 9, 2017   (EP) .................................. 17160188

(51) Int. Cl.
*G01R 15/16* (2006.01)
*H02H 11/00* (2006.01)
(Continued)

(52) U.S. Cl.
CPC ........... *H02H 11/001* (2013.01); *G01R 15/16* (2013.01); *G01R 19/155* (2013.01); *G01R 31/52* (2020.01); *H02H 1/0007* (2013.01); *H02H 3/338* (2013.01)

(58) Field of Classification Search
CPC .... H02H 11/001; H02H 3/338; H02H 1/0007; G01R 15/16; G01R 19/15; G01R 19/155
See application file for complete search history.

(56) References Cited

U.S. PATENT DOCUMENTS

| | | | |
|---|---|---|---|
| 6,094,329 A * | 7/2000 | Heinz | H02H 3/338 361/45 |
| 2014/0139047 A1* | 5/2014 | Haines | H02G 3/081 307/140 |

FOREIGN PATENT DOCUMENTS

| | | |
|---|---|---|
| DE | 10 2010 050 767 B3 | 2/2012 |
| DE | 10 2012 219 542 A1 | 7/2013 |

(Continued)

OTHER PUBLICATIONS

Machine Translation of DE102013205236 to English by ESPACENET on Feb. 25, 2021, 13 pages. (Year: 2021).*

(Continued)

*Primary Examiner* — Harry R Behm
(74) *Attorney, Agent, or Firm* — Seed Intellectual Property Law Group LLP

(57) ABSTRACT

A DI-circuit breaker device includes a summation current converter for detecting fault currents in a phase conductor and a neutral conductor, and a detection device for detecting fault states of a protective ground conductor. The detection device detects the presence of a phase voltage on the protective ground conductor as a fault state. The detection device has a capacitive sensor which, when touched by a user, forms an electric capacitor with an impedance relative to ground potential. The detection device further has evaluating electronics adapted to determine a phase position by connecting the sensor to the phase conductor and, separately therefrom, to the neutral conductor. The evaluating electronics determine the absence of a phase voltage on the protective ground conductor when there is no voltage between the (Continued)

neutral conductor and the protective ground conductor when phase is present at the phase conductor. Further, a corresponding operating method is described.

10 Claims, 2 Drawing Sheets

(51) Int. Cl.
  *G01R 31/52* (2020.01)
  *G01R 19/155* (2006.01)
  *H02H 1/00* (2006.01)
  *H02H 3/33* (2006.01)

(56) References Cited

FOREIGN PATENT DOCUMENTS

| DE | 102013205236 A1 * | 4/2014 | ................ B60L 3/12 |
| DE | 10 2013 212 739 B3 | 12/2014 | |
| DE | 10 2016 105 882 A1 | 10/2017 | |
| EP | 0 806 825 B1 | 7/2003 | |

OTHER PUBLICATIONS

International Search Report dated May 30, 2018, for International Application No. PCT/EP2018/055417, 7 pages (with English translation).

\* cited by examiner

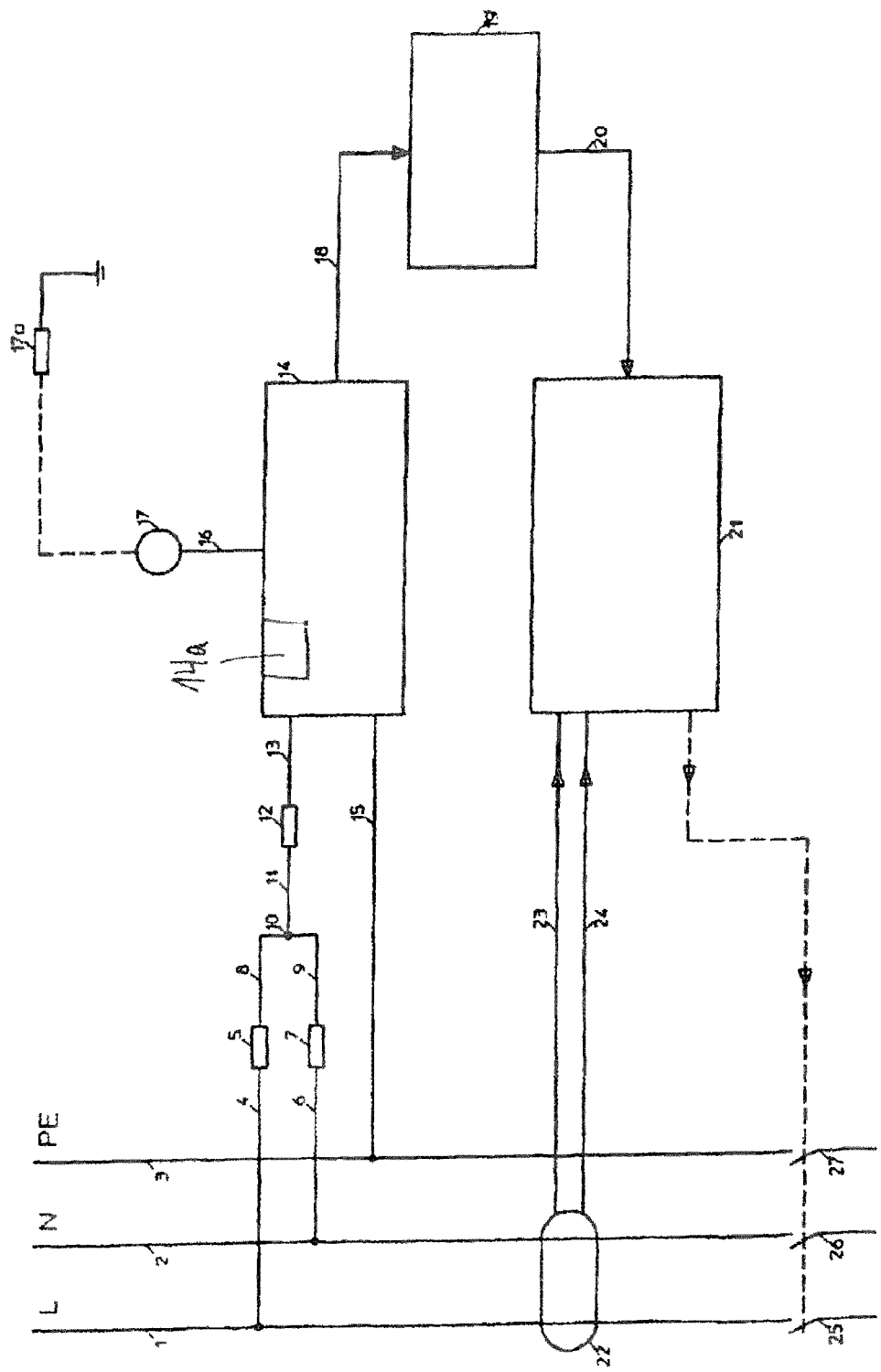

DI-CIRCUIT BREAKER DEVICE AND OPERATING METHOD FOR DETECTING A VOLTAGE ON A PEN CONDUCTOR

BACKGROUND

Technical Field

The present disclosure proceeds from a DI-circuit breaker device having the features of the preamble of Patent Claim 1. A circuit breaker device of this kind is known from EP 0 806 825 B1.

Description of the Related Art

Delay insensitive (DI)-circuit breaker devices known from the prior art include a detection device having a sensor which can be touched by a user and which has a sensor surface comprising a conductive material which is pulled to ground potential when touched by the user provided the requisite electrical contact between the hand of the user and the sensor surface is produced by touching. The detection device is electrically connected to the protective ground conductor so that, when touched, a conclusion can be reached as to whether or not the protective ground conductor is free of voltage by detecting a voltage drop between the electrically conductive sensor surface and the protective ground conductor.

However, known DI-circuit breaker devices have the drawback that they also enable an electrically insulated switch-on, for example, in that a user wears a glove that is not electrically conductive or only poorly conductive so that the above-mentioned safety function is ineffective. Further, a protective ground conductor with insufficiently low impedance may also be detected as "good" in this way. Therefore, existing sensors do not suffice to achieve a reliable detection of the protective ground conductor state and to guarantee the absence of voltage therein, optionally when protective clothing is used (gloves, shoes, etc.).

BRIEF SUMMARY

Therefore, the present disclosure describes further developments of the DI-circuit breaker device mentioned above in such a way that it also allows a reliable checking of the protective ground conductor when the DI-circuit breaker device is actuated in an electrically isolated manner.

The present disclosure provides a DI-circuit breaker device having the features of Claim 1. Independent Claim 12 is directed to a corresponding operating method. The dependent claims are each directed to advantageous embodiment forms of the present disclosure.

Accordingly, it is provided that the detection device has a capacitive sensor which, when touched by a user, forms an electric capacitor with a capacitive reactance relative to ground potential, the detection device further having evaluating electronics, for example, a microcontroller, which is adapted to determine a position of the phase conductor by connecting the sensor to the phase conductor and, separately therefrom, to the neutral conductor. The evaluating electronics draw a conclusion about the absence of a phase voltage on the protective ground conductor when it is established by the evaluating electronics that there is no voltage between the neutral conductor and the protective ground conductor when phase is present at the phase conductor.

BRIEF DESCRIPTION OF THE SEVERAL VIEWS OF THE DRAWINGS

Further particulars of the disclosure will be described with reference to the following figures. In the drawings:

FIG. 2 is a block wiring diagram of a DI-circuit breaker device according to an embodiment form of the disclosure.

DETAILED DESCRIPTION

Figure 1:
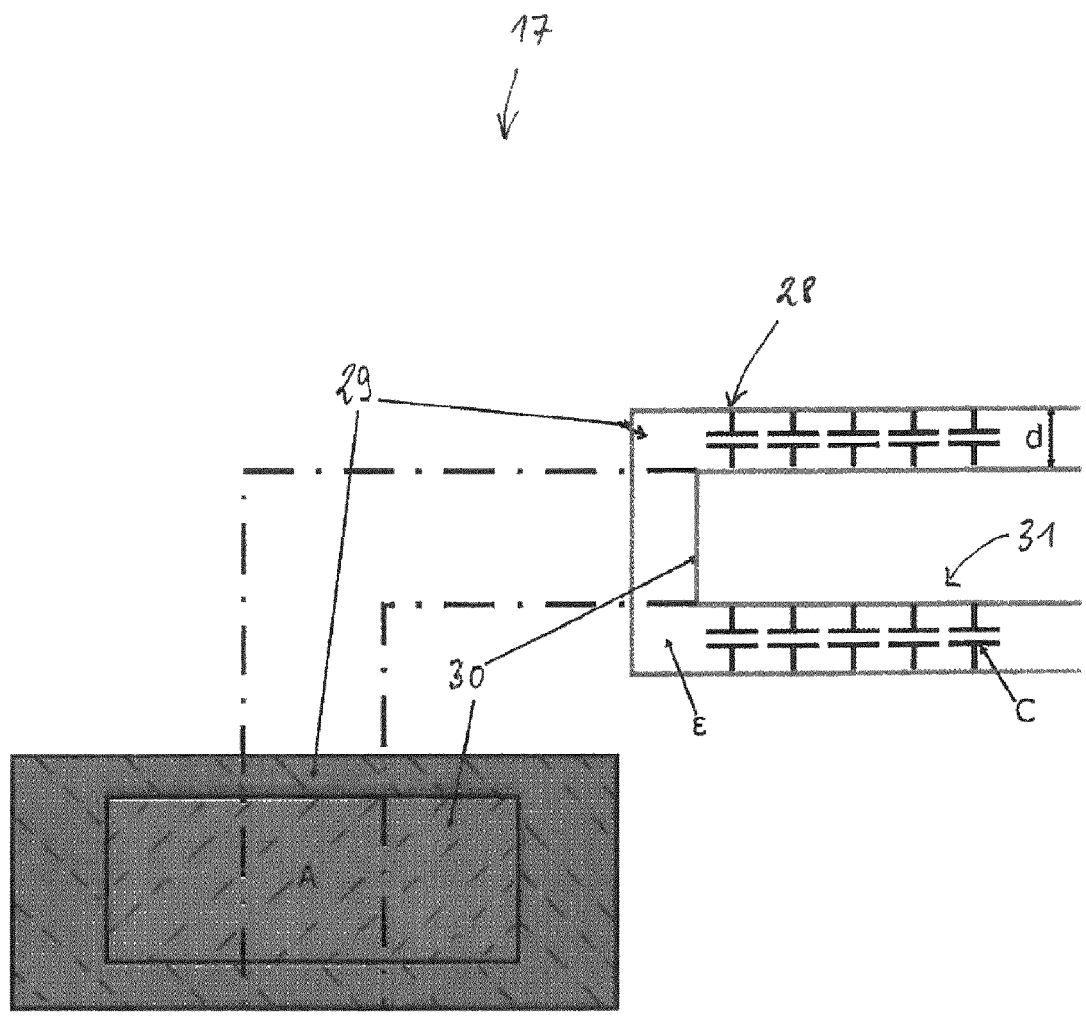
FIG. 1 is a schematic diagram of an embodiment form showing the construction of a capacitive sensor for use in a DI-circuit breaker device according to the disclosure.

The electrically conductive sensor surface utilized in the prior-art circuit breaker devices is replaced by a capacitive sensor surface so that a direct, electrically conductive connection to the sensor surface need not be produced. In order to generate an evaluatable signal, the sensor should advantageously be configured such that a sufficiently large sensor signal is provided even in case of thick protective clothing. The starting point for the sensor principle is the plate capacitor, which can be calculated as follows:

$$C = \frac{\varepsilon A}{d} \qquad \text{(Equation 1)}$$

It is desirable to obtain a high sensor capacitance so that a current which is as high as possible is adjusted via the resulting capacitive reactance:

$$X_C = \frac{1}{j\omega C} \qquad \text{(Equation 2)}$$

However, this sensor current may not be of an order of magnitude that could injure the user. In an advantageous embodiment, a current intensity of a few microamperes should be aimed for.

Accordingly, it can be provided that an outer side of a dielectric housing of the DI-circuit breaker device forms the capacitor with an electrical conductor when touched by a user. For example, the electrical conductor can be accommodated in a housing gap, attached to the outer side of the housing or can be, or have, a coating on the inner side of the housing.

In order to achieve the largest possible contact surface between a user's hand and the housing and, accordingly, to achieve the largest effective capacitor surface A, it can be provided that the outer side of the housing is ergonomically shaped to the extent that a large-area contact between a user's hand, or the glove enclosing the hand, and the outer side of the housing is produced when the housing is grasped by the user's hand or glove. The capacitor can be supplied with a voltage via the electrical conductor. In some cases, the electrical conductor can be electrically connected to the detection device for this purpose.

When the capacitance of the capacitor is determined according to Equation 1, $\varepsilon$ can be the permittivity of the dielectric and d can be the thickness of the dielectric, which can be the sum of a housing thickness, a thickness of human skin, possible trapped air, and optionally a glove material thickness, where A can be the surface area of the electrical conductor at the inner side covered by the user's touch.

It is advantageous to increase the size of the housing of the DI-circuit breaker device, or at least of the electrical conductor at the inner side of the housing, to at least $3 \times 10^{-3}$ m², which corresponds approximately to the surface area of two hands. Further, the housing surface should contact the user's hands in as flat a manner as possible so that the housing can have an ergonomic geometry at least at the outer side with which the user comes in contact.

The evaluating electronics can be adapted to determine a phase position on the phase conductor (L) and neutral conductor (N) in that they successively connect the phase conductor and the neutral conductor to the sensor and test in each instance for the presence of a voltage drop. Accordingly, instead of testing the protective ground conductor directly as provided by the known prior-art devices, it can be provided that the conductors L and N are initially connected to the capacitive sensor successively. Depending on the signals obtained, therefore, qualitatively detected voltage drops (yes/no), it is assessed whether or not a testing phase can be introduced. After evaluation of the obtained signals, the phase can be associated with a phase position on the N conductor or the L conductor. Accordingly, the evaluating electronics can be adapted to establish the phase position via the qualitatively detected voltage drops at the phase conductor and the neutral conductor corresponding to the following truth table:

| L(N) ↔ Sensor | N(L) ↔ Sensor | Phase Position |
|---|---|---|
| 0 | 0 | unascertainable |
| 0 | 1 | N(L) |
| 1 | 0 | L(N) |
| 1 | 1 | Unascertainable |

Next, the phase and the neutral conductor can be tested against the protective ground conductor. In so doing, it can be observed whether or not the potential difference between the neutral conductor and the protective ground conductor lies below a permissible value for a touch voltage, for example, below 50 V.

Accordingly, the evaluating electronics can be further adapted to test the phase conductor against the protective ground conductor and the neutral conductor against the protective ground conductor for a voltage drop with knowledge of the phase position, and the evaluating electronics conclude that the protective ground conductor is operating properly only when a voltage drop is present corresponding to the determined phase position relative to the phase conductor and voltage is absent corresponding to the determined phase position relative to the neutral conductor, or a voltage drop lies below a touch voltage.

The evaluating electronics can be adapted to establish a state of the protective ground (PE) conductor by testing the phase conductor against the protective ground conductor and the neutral conductor against the protective ground conductor for a voltage drop corresponding to the following truth table:

| Phase ↔ PE | Neutral Conductor ↔ PE | PE State |
|---|---|---|
| 0 | 0 | Not present or high-impedance |
| 0 | 1 | Conducting voltage |
| 1 | 0 | Present and voltage-free |
| 1 | 1 | Function not present |

If the testing of the potential difference between the neutral conductor and the protective ground conductor shows that it lies below a permissible touch voltage, a testing of the protective ground conductor quality can be carried out subsequently by the evaluating electronics, optionally a testing of low impedance of the protective ground conductor.

If this quality test is also passed, an enabling signal can be sent from the detection device to a switching stage for controlling a DI-switch, and the output of the DI-circuit breaker device can accordingly be switched on.

According to another aspect, the present disclosure is directed to a method for the operation of a DI-circuit breaker device of the type described above, which method has the following steps:

touching the sensor of the DI-circuit breaker device with a hand which is optionally enclosed in a glove, an electric capacitor being formed with a capacitive reactance relative to ground potential;

the phase conductor and the neutral conductor are successively connected to the sensor and a phase position is established therefrom;

with the phase position being known, the phase conductor is tested against the protective ground conductor and the neutral conductor is tested against the protective ground conductor for a voltage drop;

switching contacts of the phase conductor, neutral conductor and protective ground conductor are closed only when the test has shown that the protective ground conductor is present/has low impedance and/or is free of voltage.

The method can further comprise grasping a housing of the DI-circuit breaker device, the grasping being carried out in such a way that the largest possible contact surface between a user's hand or glove and the outer side of the housing is produced. In order to facilitate this, it can be provided that the outer side of the housing is formed ergonomically.

FIG. 1 schematically shows the construction of a capacitive sensor 17 for use in an inventive DI-circuit breaker device according to an embodiment of the present disclosure. Accordingly, the sensor 17 is substantially formed by the housing 29 of the DI-circuit breaker device. The housing 29 has an electrical conductor 30 at its inner side 31. The electrical conductor 30 can be, for example, a metal coating of the inner side 31 of the housing 29. The electrical conductor 30 can be connected to the evaluating electronics 14a of the detection device 14 in order, according to the disclosure, to be connected to the phase conductor or the neutral conductor for the purpose of determining the phase position (see FIG. 2). The housing 29 has a surface 28 which can be enveloped by a user's hand. It constitutes a first electrode of the capacitor formed by the conductor 31. The housing material of thickness d forms the dielectric of the capacitor and has a permittivity E. The permittivity describes the dielectric conductivity of the housing material.

The surface area of the electrical conductor 30 at the inner side 31 of the housing 29 is the maximum available sensor surface. The capacitive surface area A actually realized is defined precisely by the overlapping of the housing surface 28 enclosed by a user's hand and the sensor surface A. Accordingly, the thickness d of the housing 29 forms precisely the distance between the capacitor plates. The effective capacitance and, therefore, the sensor capacitance can be calculated from the above-mentioned values based on the equation for the plate capacitor, Equation 1. This can be carried out approximately as described in the following.

In the following example, the sensor capacitance between the sensor surface and the hand is established in a simplified manner. The indicated surface area corresponds to the effective capacitive surface of the sensor 17. The permittivity E is ignored as parameter in order to focus on the sensor geometry. Let the permittivity of the uppermost layer of skin be identical to that of the glove, then:

$$\varepsilon = 1 - \frac{F}{m};$$

the thickness of the uppermost skin layer $d_1 = 30 \sim 10^{-6}$ m;
the thickness of a glove $d_2 = 7 \cdot 10^{-3}$ m;
the housing thickness is approximately 1 mm;
the surface of a thumb $A_1$ corresponds to approximately $(20 \cdot 10^{-3} \text{ m}) \cdot (20 \cdot 10^{-3} \text{ m}) = 400 \cdot 10^{-6}$ m$^2$;
the surface of a hand $A_2$ corresponds to approximately $(150 \cdot 10^{-3} \text{ m}) \cdot (100 \cdot 10^{-3} \text{ m}) = 15 \cdot 10^{-3}$ m$^2$.

Inserting the values $d_1$ and $A_1$ in Equation 1 yields the case: Thumb without glove on sensor.

$$C_1 = \frac{\varepsilon A_1}{d_1} = \frac{1 F \cdot (400 \cdot 10^{-6} m^2)}{m \cdot (30 \cdot 10^{-6} m)} = 13.\overline{3} F \quad (3)$$

Substituting $d_2$ for $d_1$ yields the case: Thumb with glove on sensor.

$$C_1 = \frac{\varepsilon A_1}{d_2} = \frac{1 F \cdot (400 \cdot 10^{-6} m^2)}{m \cdot (7 \cdot 10^{-3} \cdot m)} = 0.0\overline{571428} F \quad (4)$$

Assuming a series connection of skin capacitance $C_1$ and glove capacitance $C_2$ gives the following total capacitance:

$$C_{total1} = \frac{1}{\frac{1}{C_1} + \frac{1}{C_2}} = \frac{1}{\frac{1}{13.\overline{3}F} + \frac{1}{0.0\overline{571428}F}} \approx 0.0569 \ F \quad (5)$$

Ratioing the results without glove in Equation 3 with the results with glove in Equation 5 gives the following value:

$$\frac{C_1}{C_{total1}} \approx \frac{13.\overline{3}F}{0.0569 \ F} \approx 234.33 \quad (6)$$

Since capacitance C is indirectly proportional to reactance $X_C$, a lower sensor capacitance results in poorer sensor current (based on Ohm's law). Accordingly, a higher capacitance results in a higher sensor current. The same capacitance calculation (Equation 5 to Equation 6) carried out with $A_2$ and $d_2$ yields the following result for the new ratio:

$$\frac{C_1}{C_{total2}} \approx \frac{13.\overline{3}F}{1.846 \ F} \approx 7.22 \quad (7)$$

Accordingly, with the sensor surface remaining the same, the sensor signal is poorer by factor 234.33 (independent from the material constant) when a glove is used. If the sensor surface is increased to the magnitude of the hand surface, the signal with glove is poorer only by factor 7.22 compared with the thumb sensors known from the art with correspondingly small sensor surface. Consequently, the glove can be partially compensated by the sensor surface. To be fully compensated, the surface area in the present case should be increased to 93.33×10$^{-3}$ m$^2$. However, this parameter is limited by the magnitude of the surface area of the user's hand, since only the overlapping of the hand surface and the sensor surface is considered as effective surface area.

Therefore, it is advantageous to increase the effective sensor surface to the magnitude of two hands, for example, to 30×10$^{-3}$ m$^2$. Further, the housing surface 28 should contact the hands of the user in as flat a manner as possible so that an ergonomic design of the housing surface 28 is preferable.

FIG. 2 shows a block wiring diagram of an advantageous embodiment form of the DI-circuit breaker device according to the present disclosure. In this case, the L phase conductor 1 is connected to a protective impedance 5 via a line 4 and the neutral conductor 2 is connected to a protective impedance 7 via a line 6. Protective impedances 5, 7 are connected to a node 10 on the output side by conductors 8, 9. The node 10 is connected via a line 11 to a further protective impedance 12 which is connected on the output side via a line 13 to a device 14 for detecting the state of the protective ground conductor. The protective impedances 5, 7 and 12 serve to limit current. The device 14 is further connected to the protective ground conductor 3 via a line 15 and to a sensor 17 via a line 16. According to the disclosure, the sensor 17 is a capacitive sensor, for example, a sensor such as that described referring to FIG. 1.

The output of the device 14 is connected via a conductor 18 to a switching stage 19 which switches a DI-ground fault circuit interrupter 21 via a line 20. The DI-ground fault circuit interrupter 21 is connected to a summation current converter 22 whose primary winding is formed by the phase conductor 1 and the neutral conductor 2. The summation current converter 22 further has a secondary winding which conducts induced voltages via lines 23, 24 to evaluation electronics contained in the DI-switch 21. The DI-switch 21 is mechanically connected to switching contacts 25, 26, 27 which are connected into lines 1, 2, 3.

Depending on the position of the phase conductor, there is a flow of current to the node 10 from line 4 via the protective impedance 5 and line 8, or via line 6, the protective impedance 7 and line 9, and to the protective ground conductor 3 from the node 10 via line 11, the protective impedance 12, the conductor 13, the detection device 14 and line 15. Normally, i.e., when the phase conductor 1, the neutral conductor 2 and the protective ground conductor 3 are correctly connected, this current flows through the device 14 via line 15 to the protective ground conductor 3.

However, if this current is absent, for example, because the protective ground conductor is not connected or is interrupted, the device 14 detects this fault state because of the absence of any current flowing across the conductor 15 to the protective ground conductor 3 and, via an isolated switching stage 19, switches the DI-circuit breaker 21 which opens switching contacts 25, 26, 27 and accordingly interrupts the conductors 1, 2, 3.

Beyond this, the detection device 14 is configured to detect the presence of an external voltage or line voltage to the protective ground conductor 3. The capacitive sensor 17 which, when touched by a user, forms an electric capacitor with a capacitive reactance relative to ground, serves for this purpose. The detection device 14 has evaluating electronics 14a which are adapted to determine the position of the phase conductor by connecting the sensor 17 to the phase conductor 1 and, separately therefrom, to the neutral conductor 2.

Therefore, instead of directly testing the protective ground conductor as is provided in the prior-art arrangements, the neutral conductor and the protective ground conductor are first successively connected to the sensor 17 in order to associate the phase with a phase position on the L conductor or the N conductor. Depending on the obtained signals, it is assessed whether or not the next testing phase can be initiated:

| L(N) ↔ Sensor | N(L) ↔ Sensor | Phase Position |
|---|---|---|
| 0 | 0 | unascertainable |
| 0 | 1 | N(L) |
| 1 | 0 | L(N) |
| 1 | 1 | unascertainable |

After determining the phase position, the phase conductor and the neutral conductor are tested against the protective ground (PE) conductor. After a signal evaluation, it can be assessed whether or not a difference in potential exists between the neutral conductor and the protective ground conductor and, if so, whether or not this potential difference lies below a touch voltage. A negligible touch voltage may be assumed, for example, if the potential difference is less than 50 V. The signal evaluation for assessing the potential difference between the neutral conductor and the PE can be carried out corresponding to the following truth table:

| Phase ↔ PE | Neutral Conductor ↔ PE | PE State |
|---|---|---|
| 0 | 0 | Not present or high-impedance |
| 0 | 1 | Conducting voltage |
| 1 | 0 | Present and voltage-free |
| 1 | 1 | Function not present |

A testing of the protective ground conductor quality can be carried out subsequently, for example, by establishing a resistance of the protective ground conductor.

The various embodiments described above can be combined to provide yet further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A DI-circuit breaker device, comprising:
    a summation current converter for detecting fault currents in a phase conductor and a neutral conductor; and
    a detection device for detecting fault states of a protective ground conductor,
    wherein the detection device is connected on the input side to the phase conductor, the neutral conductor and the protective ground conductor and, on the output side, to a switching stage for controlling a DI-circuit breaker, wherein the DI-circuit breaker is adapted to switch switching contacts in the phase conductor, the neutral conductor and the protective ground conductor,
    wherein the detection device detects the presence of a phase voltage on the protective ground conductor as a fault state,
    wherein the detection device has a capacitive sensor which, when touched by a user, forms an electric capacitor with a capacitive reactance with respect to ground potential, wherein the detection device further has evaluating electronics which are adapted to determine a phase position by connecting the capacitive sensor to the phase conductor and, separately therefrom, to the neutral conductor, wherein the evaluating electronics determine the absence of the phase voltage on the protective ground conductor when it is established by the evaluating electronics that there is no voltage between the neutral conductor and the protective ground conductor,
    wherein an outer side of a dielectric housing of the DI-circuit breaker device forms the electric capacitor with an electrical conductor of the dielectric housing upon being touched by a user, and
    wherein a capacitance of the electric capacitor is determined according to $C=\varepsilon A/d$, wherein $\varepsilon$ is a permittivity of the dielectric of the electric capacitor which depends on a sum of a thickness of the dielectric housing, a thickness of human skin, possible trapped air, and a glove material thickness, and A is a surface area of the electrical conductor at an inner side of the dielectric housing covered by a user's touch.

2. The DI-circuit breaker device according to claim 1, wherein the electrical conductor is accommodated in a housing gap, attached to the outer side of the dielectric housing or is, or has, a coating on the inner side of the dielectric housing.

3. The DI-circuit breaker device according to claim 1, wherein the outer side of the dielectric housing is ergonomically shaped to an extent that a large area of contact between a user's hand, or a glove enclosing the user's hand, is produced when the user grasps the dielectric housing with their hand or glove.

4. The DI-circuit breaker device according to claim 1, wherein the electric capacitor is supplied with a voltage via the electrical conductor.

5. A DI-circuit breaker device, comprising:
    a summation current converter for detecting fault currents in a phase conductor and a neutral conductor; and
    a detection device for detecting fault states of a protective ground conductor,
    wherein the detection device is connected on the input side to the phase conductor, the neutral conductor and the protective ground conductor and, on the output side, to a switching stage for controlling a DI-circuit breaker, wherein the DI-circuit breaker is adapted to switch switching contacts in the phase conductor, the neutral conductor and the protective ground conductor,
    wherein the detection device detects the presence of a phase voltage on the protective ground conductor as a fault state,
    wherein the detection device has a capacitive sensor which, when touched by a user, forms an electric capacitor with a capacitive reactance with respect to ground potential, wherein the detection device further has evaluating electronics which are adapted to determine a phase position by connecting the capacitive sensor to the phase conductor and, separately therefrom, to the neutral conductor, wherein the evaluating electronics determine the absence of the phase voltage on the protective ground conductor when it is established by the evaluating electronics that there is no voltage between the neutral conductor and the protective ground conductor,
    wherein the evaluating electronics are adapted to determine the phase position on the phase conductor and neutral conductor by successively connecting the phase conductor and the neutral conductor to the capacitive sensor and testing in each instance for the presence of a voltage drop.

6. The DI-circuit breaker device according to claim 5, wherein the evaluating electronics are adapted to establish the phase position via the voltage drops at the phase conductor and the neutral conductor corresponding to the following truth table:

| L(N) ↔ Sensor | N(L) ↔ Sensor | Phase Position |
|---|---|---|
| 0 | 0 | unascertainable |
| 0 | 1 | N(L) |
| 1 | 0 | L(N) |
| 1 | 1 | Unascertainable |

7. A DI-circuit breaker device, comprising:
a summation current converter for detecting fault currents in a phase conductor and a neutral conductor; and
a detection device for detecting fault states of a protective ground conductor,
wherein the detection device is connected on the input side to the phase conductor, the neutral conductor and the protective ground conductor and, on the output side, to a switching stage for controlling a DI-circuit breaker, wherein the DI-circuit breaker is adapted to switch switching contacts in the phase conductor, the neutral conductor and the protective ground, conductor, wherein the detection device detects the presence of a phase voltage on the protective ground conductor as a fault state,
wherein the detection device has a capacitive sensor which, when touched by a user, forms an electric capacitor with a capacitive reactance with respect to ground potential, wherein the detection device further has evaluating electronics which are adapted to determine a phase position by connecting the capacitive sensor to the phase conductor and, separately therefrom, to the neutral conductor, wherein the evaluating electronics determine the absence of the phase voltage on the protective ground conductor when it is established by the evaluating electronics that there is no voltage between the neutral conductor and the protective ground conductor,
wherein a microcontroller is further adapted to test the phase conductor against the protective ground conductor and the neutral conductor against the protective ground conductor for a voltage drop with knowledge of the phase position, wherein the evaluating electronics conclude that the protective ground conductor is operating properly only when a voltage drop is present corresponding to the determined phase position relative to the phase conductor and the voltage drop is absent corresponding to the determined phase position relative to the neutral conductor, or the voltage drop lies below a touch voltage.

8. The DI-circuit breaker device according to claim 7, wherein the evaluating electronics are adapted to establish a state of the protective ground conductor by testing the phase conductor against the protective ground conductor and the neutral conductor against the protective ground conductor for a voltage drop corresponding to the following truth table:

| Phase ↔ PE | Neutral conductor ↔ PE | PE State |
|---|---|---|
| 0 | 0 | Not present or high-impedance |
| 0 | 1 | Conducting voltage |
| 1 | 0 | Present and voltage-free |
| 1 | 1 | Function not present |

9. A method for operation of a DI-circuit breaker device that includes a summation current converter for detecting fault currents in a phase conductor and a neutral conductor, and a detection device for detecting fault states of a protective ground conductor,
wherein the detection device is connected on the input side to the phase conductor, the neutral conductor and the protective ground conductor and, on the output side, to a switching stage for controlling a DI-circuit breaker, wherein the DI-circuit breaker is adapted to switch switching contacts in the phase conductor, the neutral conductor and the protective ground conductor, wherein the detection device detects the presence of a phase voltage on the protective ground conductor as a fault state,
wherein the detection device has a capacitive sensor which, when touched by a user, forms an electric capacitor with a capacitive reactance with respect to ground potential, wherein the detection device further has evaluating electronics which are adapted to determine a phase position by connecting the capacitive sensor to the phase conductor and, separately therefrom to the neutral conductor, wherein the evaluating electronics determine the absence of the phase voltage on the protective ground conductor when it is established by the evaluating electronics that there is no voltage between the neutral conductor and the protective ground conductor,
the method comprising the steps of:
touching the sensor of the DI-circuit breaker device with a hand which is enclosed in a glove, wherein the electric capacitor is formed with a capacitive reactance relative to ground potential;
successively connecting the phase conductor and the neutral conductor to the sensor and establishing the phase position therefrom;
with the phase position being known, testing the phase conductor against the protective ground conductor and testing the neutral conductor against the protective ground conductor for a voltage drop; and
closing switching contacts of the phase conductor, neutral conductor and protective ground conductor only when the test has shown that the protective ground conductor is present/has low impedance and/or is free of voltage.

10. The method according to claim 9, wherein the method further includes grasping a housing of the DI-circuit breaker device so that a largest possible contact surface between the hand or glove and the outer side of the housing is produced.

* * * * *